US006975105B2

(12) United States Patent
Gudin

(10) Patent No.: US 6,975,105 B2
(45) Date of Patent: Dec. 13, 2005

(54) SIDE SUPPORTS WITH ADJUSTABLE CENTER OF GRAVITY

(75) Inventor: Naum Gudin, Cherry Hill, NJ (US)

(73) Assignee: inTEST IP Corporation, Cherry Hill, NJ (US)

( * ) Notice: Subject to any disclaimer, the term of this patent is extended or adjusted under 35 U.S.C. 154(b) by 20 days.

(21) Appl. No.: 10/380,313

(22) PCT Filed: Sep. 17, 2001

(86) PCT No.: PCT/US01/28985

§ 371 (c)(1),
(2), (4) Date: Jun. 3, 2003

(87) PCT Pub. No.: WO02/24400

PCT Pub. Date: Mar. 28, 2002

(65) Prior Publication Data

US 2004/0032248 A1 Feb. 19, 2004

Related U.S. Application Data

(60) Provisional application No. 60/234,037, filed on Sep. 20, 2000.

(51) Int. Cl.$^7$ ............................................. G01R 31/00
(52) U.S. Cl. ..................................... 324/158.1; 324/758
(58) Field of Search ........................... 324/158.1, 73.1, 324/765, 758; 73/866.5; 33/573–574; 248/650–652, 124.2; 414/589–590

(56) References Cited

U.S. PATENT DOCUMENTS

| 4,973,015 A | * | 11/1990 | Beaucoup et al. | ....... 248/124.2 |
| 5,450,766 A | * | 9/1995 | Holt | ........................... 73/866.5 |
| 5,608,334 A | * | 3/1997 | Holt | ........................... 324/758 |
| 5,900,737 A | | 5/1999 | Graham et al. | |
| 5,912,555 A | * | 6/1999 | Akaike et al. | ........... 324/158.1 |

FOREIGN PATENT DOCUMENTS

EP           0 468 906        1/1992

OTHER PUBLICATIONS

International Preliminary Examination Report for corresponding International Application PCT/US01/28985, dated Mar. 8, 2003.

* cited by examiner

Primary Examiner—Vinh P. Nguyen
(74) Attorney, Agent, or Firm—RatnerPrestia

(57) ABSTRACT

An apparatus is used for coupling a test head to a mounting unit such as a cradle in which the test head pivots. A base is attachable to a test head. An extension member extends away from the test head. A slider slides away from and towards a center of gravity of the test head. The slider is attachable to the mounting unit. An adjustment member extends from the extension member for fixing the position of the slider relative to the base.

12 Claims, 9 Drawing Sheets

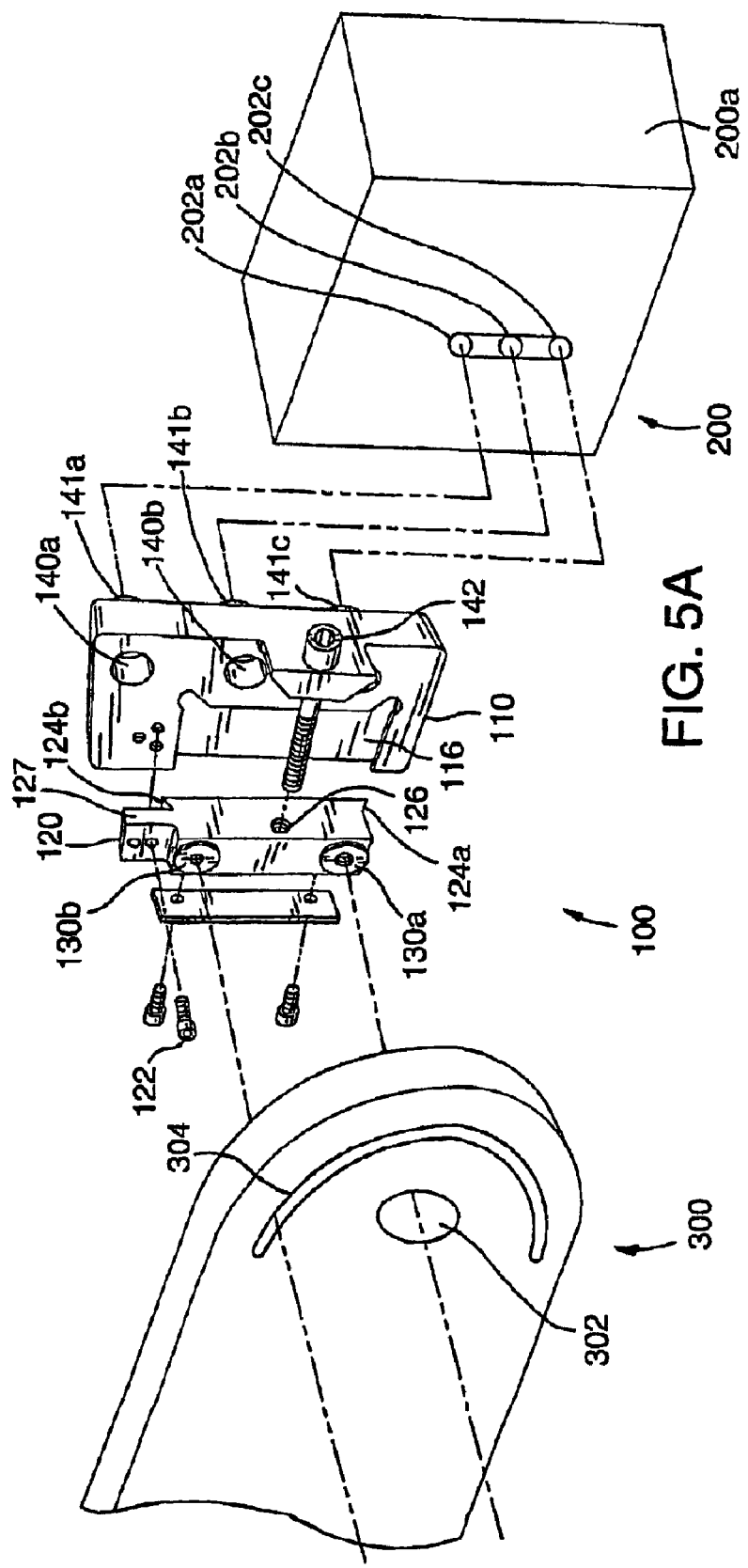

SIDE SUPPORTS WITH ADJUSTABLE CENTER OF GRAVITY

This application claims the benefit of provisional application No. 60/234,037, filed Sep. 20, 2000.

BACKGROUND OF INVENTION

In the automatic testing of integrated circuits (IC) and other electronic devices, it is desirable to bring the device to the proper temperature and to place the device to be tested in position. To perform these steps, an apparatus which is referred to as a device handler may be used. A device handler may include a wafer prober or any other apparatus that might hold the device being tested. The electronic testing itself is provided by a large and expensive automatic testing system, which includes a test head, which has been required to connect to and dock with the device handler. In such testing systems, the test head has been usually very heavy—on the order of 40 to 1000 (or more) kilograms. The reason for this heaviness is because a test head is densely packaged with electronic circuits in order to achieve accurate high speed testing.

Test head positioner systems may be used to position the test head with respect to the device handler. When the test head is accurately in position with respect to the device handler, the test head and the device handler are said to be aligned. When the test head and device handler are aligned, the fragile test head and device handler electrical connectors can be brought together (i.e. docked), enabling the transfer of test signals between the test head and the device handler. Thus, before being brought together, the fragile test head and device handler electrical connectors must be precisely aligned to avoid damaging the fragile electrical connectors.

Test head positioners are designed in several configurations, each configuration being desirable for a particular purpose. Many positioners include a test head "mounting unit." The mounting unit supports the test head and may provide one or more axes of motion for the test head. The test head mounting unit may comprise a "pivot cradle," a "translation cradle", a "yoke," or other apparatus. Generally, a pivot cradle, a translation cradle, and a yoke all comprise two parallel structures, which are arranged next to the two opposite sides of the test head and to which the test head is attached. With a pivot cradle the test head is mounted in such a way that it can pivot about an axis, which is generally orthogonal to the two parallel structures. With a translation cradle the test head is mounted in such a way that it can slide in and out, and possibly also pivot. With a yoke, the test head is rigidly attached to the two parallel structures. Examples of other structures are mentioned later. Hereinafter, the term "cradle" is used to mean a pivot cradle, a translation cradle, or a yoke.

In a tumble mode positioner, for example, the mounting unit is a pivot cradle; the test head pivots (or tumbles) about two oppositely disposed pivot points within the pivot cradle. This enables the user to tumble the test head in the pivot cradle from a position where the device handler interface board is up (for interface to horizontal plane handlers from the bottom), through 180 degrees or more, to a position where the device handler interface board is down (for interface to horizontal plane handlers from the top). An example of a tumble mode positioner is disclosed in a previous patent by Smith (U.S. Pat. No. 4,705,447), herein incorporated by reference.

In a cable pivot mode positioner, the test head pivots on the axis of the test head cables. Compared to the tumble mode positioner, a cable pivot mode positioner allows the use of reduced cable lengths. In many cable pivot positioners, the test head is rigidly attached to a yoke. The combination of yoke and test head are attached to the positioner in a manner that allows them to be rotated through 180 degrees or more about the axis of the test head cables for the previously mentioned purposes. There are several ways of implementing cable pivot positioners as described for example in U.S. Pat. Nos. 5,900,737, 5,608,334, 5,450,766, 5,241,870, 5,030,869, and 4,893,074.

Also, in both tumble mode and cable pivot positioners, it is typical to provide a means to allow the test head to be pivoted at least a few degrees about an axis that is orthogonal to the axis that provides the 180 degrees of rotation and that is parallel to the device handler interface. Thus the test head mounting unit may provide both pitch and roll motions for the test head.

Still other positioners incorporate translation cradle mounting units which provide translational in-out motion in addition to one or more axes of pivotal motion. The aforementioned U.S. Pat. Nos. 5,241,870 and 5,450,766 provide examples of such units. In these examples the test head is attached to slide units which slide in and out along two parallel structures, which are arranged next to the two opposite sides of the test head. Typically, the test head is attached to the slide units so that it may pivot about the axis defined by the two points of attachment.

Still further positioners do not use cradles. In one example, the test head mounting unit comprises a gimbal-like mechanism internal to the test head which provides rotational degrees of freedom to the test head. A first cable pivot axis supports the gimbal unit. The gimbal unit supports a second axis, which is orthogonal to the first cable pivot axis and parallel to the test interface board, and that directly supports the test head. The test head may pivot about the second axis.

After a test head is docked with a device handler, the test head may be maintained in an unlocked state relative to the axes about which it pivots. This may be done to allow the transmission of vibration from the device handler into the positioner system so that all of the vibration is not absorbed by the fragile electrical connectors, which could be destructive. In other words, by unlocking the axes of rotation so that the test head is in a "floating" state, vibrational forces are dissipated to the positioner system.

When a test head is situated in a positioner, it is desirable that the test head pivot within the mounting unit about the center of gravity of the test head. "Center of gravity of the test head" with respect to a pivot axis provided by the mounting unit means the center of gravity of the test head combined with the portions of the mounting units which pivot with it and cables or other equipment effecting balance of the test head within its mounting unit. While, during normal installation, the test head is attached to the mounting unit at the center of gravity of the test head, the center of gravity of the test head may change. This may occur, for example, if circuit boards are added (or removed from) the test head. Also, the center of gravity of the test head may be affected by the cables that extend into the test head. It is common for the cables to provide up to 30% of the total weight of the combination of the cables and the test head.

Components of the mounting unit may pivot with the test head in one or more axes. For example in a tumble mode system such as described in U.S. Pat. No. 4,705,447, the test head pivots with respect to the pivot cradle in a first axis, and the combination of the test head and pivot cradle pivot about an orthogonal axis. As another example in the cable pivot positioner shown in FIG. 7 of U.S. Pat. No. 5,450,766 the test head and yoke pivot as a combined unit about a first axis, and the test head yoke and other apparatus pivot as a unit about a second orthogonal axis. It is highly desirable for each pivot axis to pass through its respective center of gravity. In these examples, the portion of the mounting unit that pivots with the test head effectively becomes "part" of the test head to the extent it pivots with the test head.

If, however, the test head has not been positioned to pivot about a center of gravity, and is hence unbalanced then gravitational forces will try to urge the test head towards a balanced state. This may create a significant amount of stress on the test head pins through which signals are received from and transmitted to the device handler. As a test head may weigh 1000 kilograms (or more), if the center of gravity is offset by ⅛ inch (for example), the lateral forces which may be applied to the test head pins as a result of this imbalance may be considerable. By applying such forces to the extremely small and fragile pins, the pins may become worn or damaged. Alternatively, as the test head weight and imbalance may be supported by other structures (i.e., cams and guide pins), these other structures may also become worn or damaged by the imbalance. Thus, it is highly undesirable for the axis about which the test head pivots to be offset from its center of gravity.

In the past, the position of the test head in the mounting unit has been adjusted by such techniques as swapping in supports of different lengths (until the test head is pivoting about its center of gravity) or using a multiple pivot point pivot cradle and changing the pivot point which is used to couple with the test head. Yet another technique to adjust the location of the center of gravity is to add or remove weights or ballast to or from the test head. All such techniques are cumbersome and may require dismantling the equipment to provide the adjustment.

SUMMARY OF THE INVENTION

An apparatus is used for coupling a test head to a mounting unit in which the test head pivots. A base is attachable to a test head. An extension member extends away from the test head. A slider slides away from and towards a center of gravity of the test head. The slider is attachable to the mounting unit. An adjustment member extends from the extension member for fixing the position of the slider relative to the base.

BRIEF DESCRIPTION OF THE DRAWINGS

FIG. 5A is a perspective view which is useful for showing how the first embodiment is used with a test head and a pivot cradle (which is at least part of a mounting unit).

DETAILED DESCRIPTION OF THE INVENTION

Figure 1:
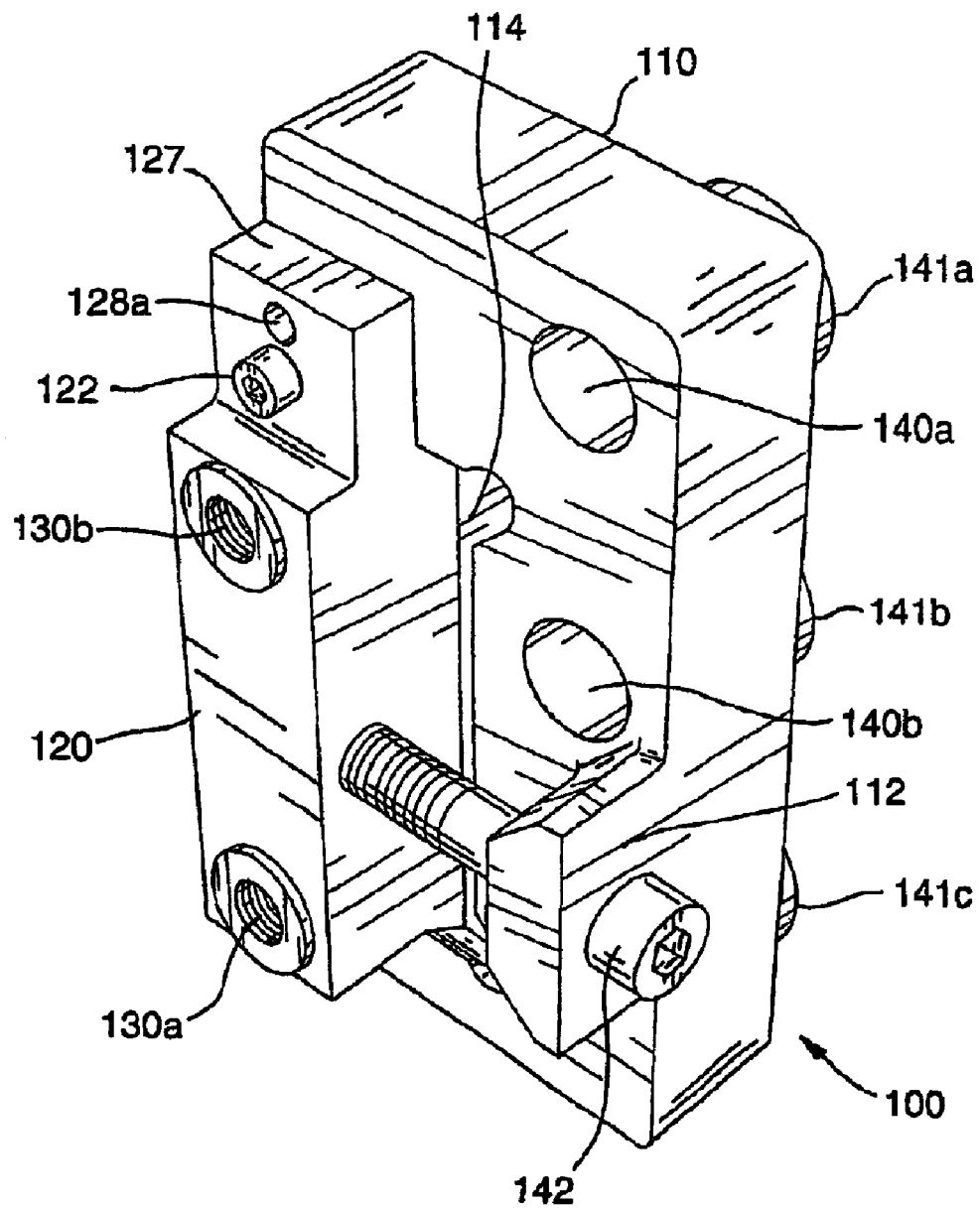
FIG. 1 is a perspective view of an apparatus for attaching a test head to a cradle in accordance with a first exemplary embodiment of the present invention.
Figure 3:
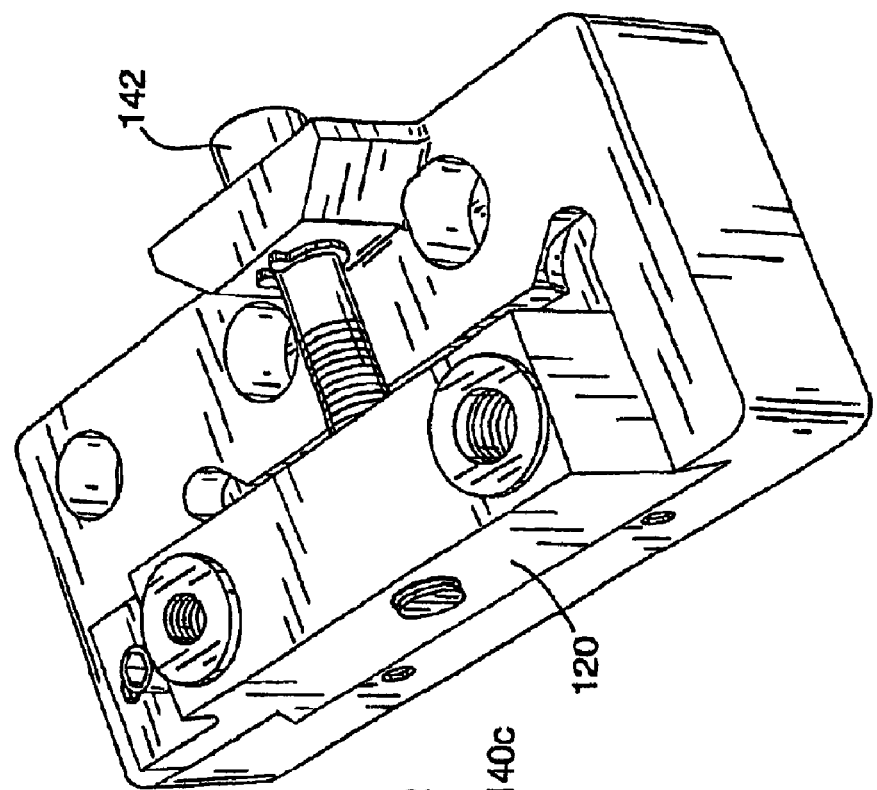
FIG. 3 shows the attachment unit of FIG. 2 in a position to accommodate a different center of gravity of the test head than what is accommodated in FIG. 2.
Figure 2:
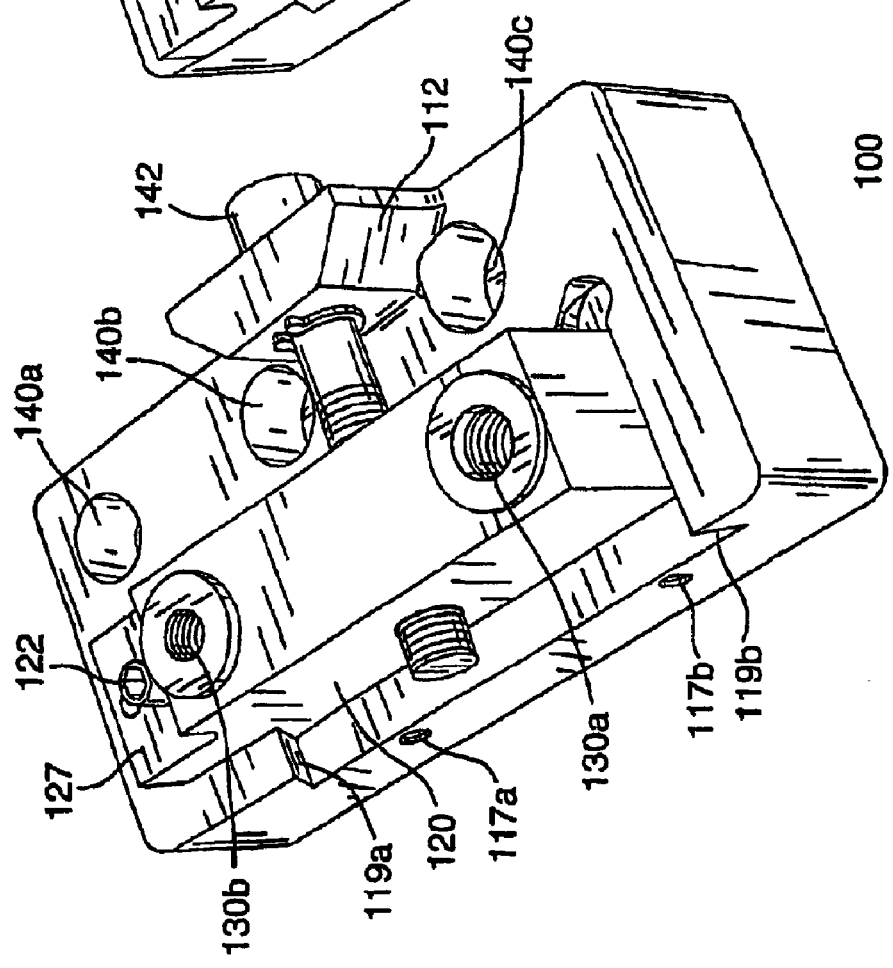
FIG. 2 is another perspective view of the above apparatus in accordance with a first exemplary embodiment of the present invention and accommodating a certain center of gravity of the test head.

It is desirable to be able to change the location of a test head within its mounting unit so that the test head pivots about its center of gravity. To change the location of the test head within the mounting unit, attachment unit 100 is used. FIGS. 1, 2 and 3 are perspective drawings of attachment unit 100. Attachment unit 100 is comprised of body 110, slider 120 and adjustment member 142. Each separate piece will be described in turn.

Body 110 includes a plurality of openings 140a, 140b, 140c which are useful for attaching attachment unit 100 to the test head. Thus, for example, bolts may be placed through openings 140a, 140b, 140c and secured to the test head in order to attach body 110 to the test head. As is shown, raised portions 141a,b,c may exist around openings 140a, 140b, 140c on the side of body 110 facing the test head. Raised portions 141a,b,c may add to the structural integrity of body 110 as well as allowing more secure attachment of body 110 to the test head.

As shown in FIGS. 1–3, body 110 includes extension member 112. Extension member 112 extends from body 110. The purpose of extension member 112 is to accommodate adjustment member 142. Thus, extension member 112 desirably includes an opening through which adjustment member 142 is inserted. In the embodiment shown in FIG. 1, extension member 112 extends away from the test head. In an alternative embodiment, however, extension member 112 may extend from body 110 and towards the test head.

Body 110 also includes channel 114. Channel 114 is a portion of body 110, and it accommodates slider 120. Thus, slider 120 is inserted into channel 114. Slider 120 slides within channel 114 towards and away from extension member 112.

Turning now to slider 120, slider 120 includes a plurality of openings 130a, 130b. These openings may be used, for example, to accommodate respective bolts which extend towards or away from the mounting unit in order to attach slider 120 to the mounting unit. For example, if the mounting unit comprises a pivot cradle, one opening (for example, 130a) may be used as the pivot point of slider 120 relative to the pivot cradle (which is at least part of a mounting unit). The other opening (for example, 130b) may be used to control the pivoting of slider 120 relative to the pivot cradle. Thus, for example, by loosening a bolt extending through opening 130b, slider 120 is then permitted to pivot relative to the pivot cradle to which it is attached. As a second example, if the mounting unit comprises a yoke, the openings 130a and 130b may be used to rigidly attach slider 120 to the yoke using bolts. As shown, additional material may be placed around openings 130a, 130b in order to improve the structural integrity of slider 120 as well as to increase the strength of the attachment between slider 120 and the cradle to which it is attached. One of ordinary skill in the art will recognize that additional openings may be provided in slider 120 should the application demand it. Also one skilled in the art will recognize that the openings may be adapted to enabling appropriate fastening to virtually any style of mounting unit.

As shown in the Figures, adjustment member 142 extends through extension member 112 and is secured to slider 120. Adjustment member 142 may have, for example, a threaded shaft which engages a threaded opening in slider 120. Thus, by rotating adjustment member 142, slider 120 moves towards and away from extension member 112. Looking, for example, in FIG. 2, by rotating adjustment member 142 in one direction, slider 120 moves towards extension member 112. Conversely, by rotating adjustment member 142 in another direction, slider 120 moves away from extension member 112.

Figure 4:
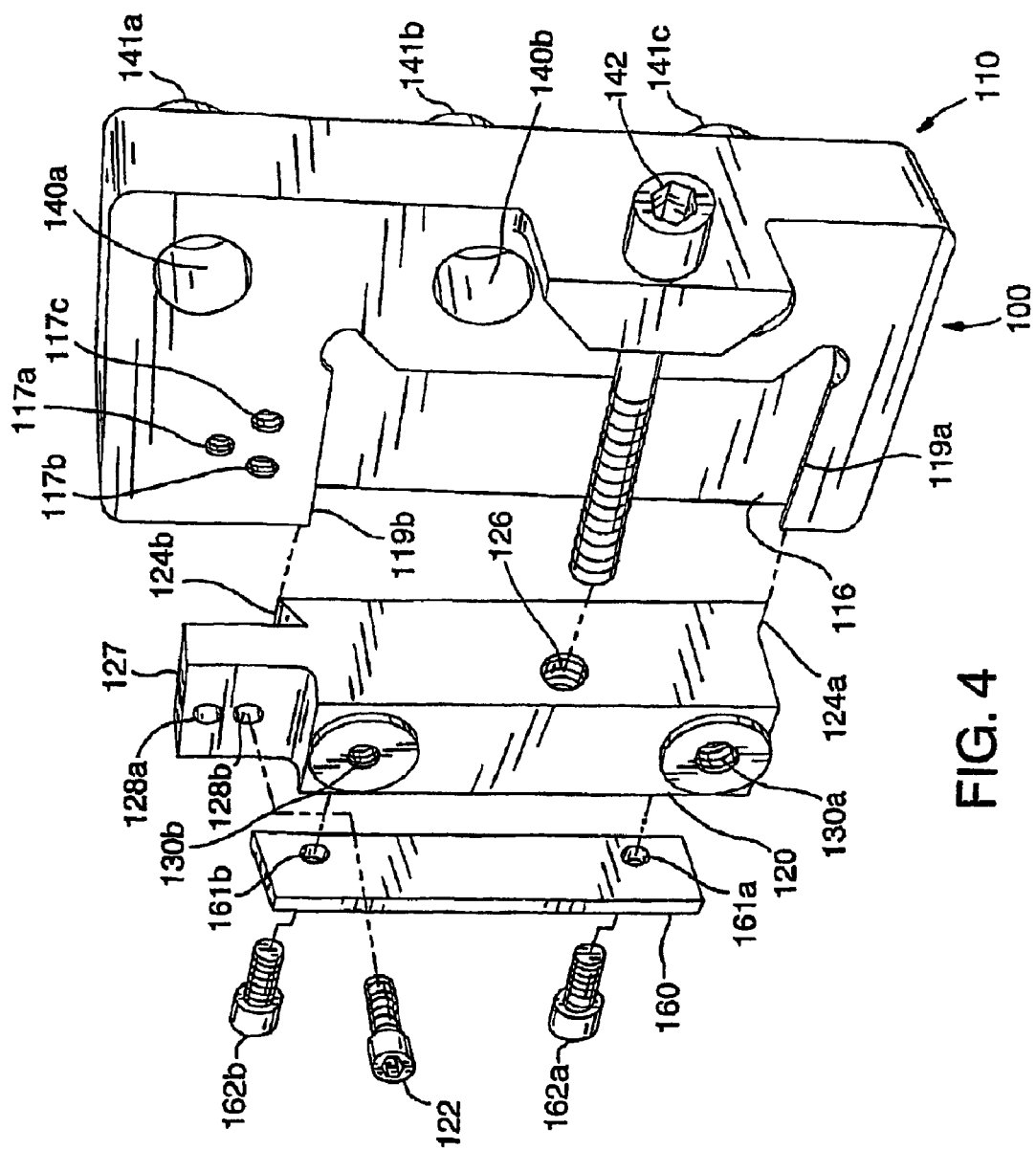
FIG. 4 is an exploded perspective view of the apparatus shown in FIGS. 1–3.

FIG. 4 is an exploded view of attachment unit 100 which is useful for explaining how the different parts which comprise attachment unit 100 fit together. As is more clearly shown in FIG. 4, slider 120 may be held within channel 114 as a result of the formation of a dovetail structure. Thus, angling the side walls 119a, 119b of channel 114 and angling the edges 124a,b of slider 120 in order to coincide with the angle of side walls 119a, 119b creates a dovetail which helps to maintain slider 120 within channel 114. This dovetail also allows slider 120 to easily slide within channel 114 as illustrated by FIGS. 2 and 3.

FIG. 4 includes plate 160. Plate 160 is attached to body 110 using screws 162a, 162b which are inserted through openings 161a, 161b. Screws 162a, 162b may then engage threaded openings 171a, 171b shown in FIGS. 2 and 3. The purpose of plate 160 is to ensure that slider 120 is not permitted to slide sufficiently away from extension member 112 so that it "falls out" of channel 114. Such a "falling out" would cause the test head to detach from the cradle. This is an extremely undesirable occurrence.

Also as shown in FIG. 4, slider 120 includes top section 127. Top section 127 includes a plurality of openings 128a, 128b. Body 110 also includes openings 117a, 117b, 117c. Openings 117a, 117b, 117c are shown in FIG. 4 in a triangle configuration. The triangle configuration ensures that there is a sufficient amount of material between the openings so that a crack does not form. It is contemplated, however, that openings 117a, 117b, 117c may also be configured in a linear orientation.

Screw member 122 may be inserted into either opening 128a or opening 128b. Openings 117a, 117b, 117c are desirably threaded openings which may be engaged by screw member 122. Thus, as slider 120 slides within channel 114, one of openings 117a, 117b, 117c will become visible either through opening 128a or opening 128b. By placing screw member 122 through the appropriate opening (i.e., either opening 128a or opening 128b) and engaging the visible opening (i.e., opening 117a, 117b, 117c) from body 110, the position of slider 120 is more securely fixed relative to body 110.

FIG. 5A illustrates how attachment unit 100 may be used to attach a test head to a pivot cradle (which is at least part of a mounting unit). As shown in FIG. 5A, test head 200 is shown with attachment locations 202a, 202b, 202c. Attachment locations 202a, 202b, 202c may be, for example, threaded openings. Pivot cradle 300 is also shown. Pivot cradle 300 includes attachment location 302 at which the cradle is attached to attachment unit 100. Pivot cradle location 304 (which may be, for example, a curved slot) is also provided in order to fix the pivot position of test head 200 relative to pivot cradle 300. Thus, for example, an appropriate threaded member may extend through attachment location 302 in order to engage opening 130a so that test head 200 pivots about attachment location 302. Another attachment member (i.e., bolt) may extend through pivot cradle location 304 in order to engage opening 130b. As the test head 200 pivots about attachment location 302, the bolt may move in an arc along pivot cradle location 304. By tightening the bolt within pivot cradle location 304, pivoting of test head 200 relative to pivot cradle 300 is stopped.

It will be appreciated that in FIG. 5A attachment unit 100 is part of the mechanism that allows test head 200 to pivot in pivot cradle 300. One of ordinary skill in the art will recognize that attachment unit 100 may be readily attached by way of openings 130a, 130b to a wide variety of alternative structures or mechanisms which are considered to be mounting units. Thus, it may be rigidly attached to a yoke. As a further example it may be rigidly attached to a bearing mechanism that is also attached to the mounting unit to facilitate low friction pivoting. This would facilitate using attachment unit 100 to attach a test head 200 to a translation cradle or a gimbal mechanism.

In practice, additional circuit boards may be added to test head 200. Alternatively, circuit boards may be taken away from test head 200. These additions or deletions will change the center of gravity of test head 200. The present invention allows the position of test head 200 within a mounting unit such as pivot cradle 300 to be changed in order to accommodate a changed center of gravity. Thus, if the center of gravity of test head 200 changes, then screw member 122 may be removed from hole 128a or 128b and adjustment member 142 may be rotated in order to change the position of body 110 relative to slider 120. In the illustrated exemplary embodiment, adjustment member 142 is a threaded member which engages threaded opening 126 in slider 120. By rotating adjustment member 142, slider 120 slides towards or away from extension member 112. By inserting and tightening screw member 122 in the appropriate hole, the location of slider 120 relative to body 110 is further fixed. If the center of gravity of test head 200 is moved towards the front of test head 200 (i.e., toward face 200a), test head 200 may be moved back by rotating adjustment member 142 so that slider 120 is in the position shown in FIG. 2. Alternatively, if the center of gravity of test head 200 is moved towards the back of the test head (i.e., away from front face 200a), adjustment member 142 may be rotated so that slider 120 is closer to (but not necessarily in) the position shown in FIG. 3. Screw member 122 is loosened and tightened as needed so that slider 120 may slide and then be fixed in position.

It will be understood to one of ordinary skill in the art that it is preferred to use two attachment units 100, one on each side of test head 200.

Figure 5B:
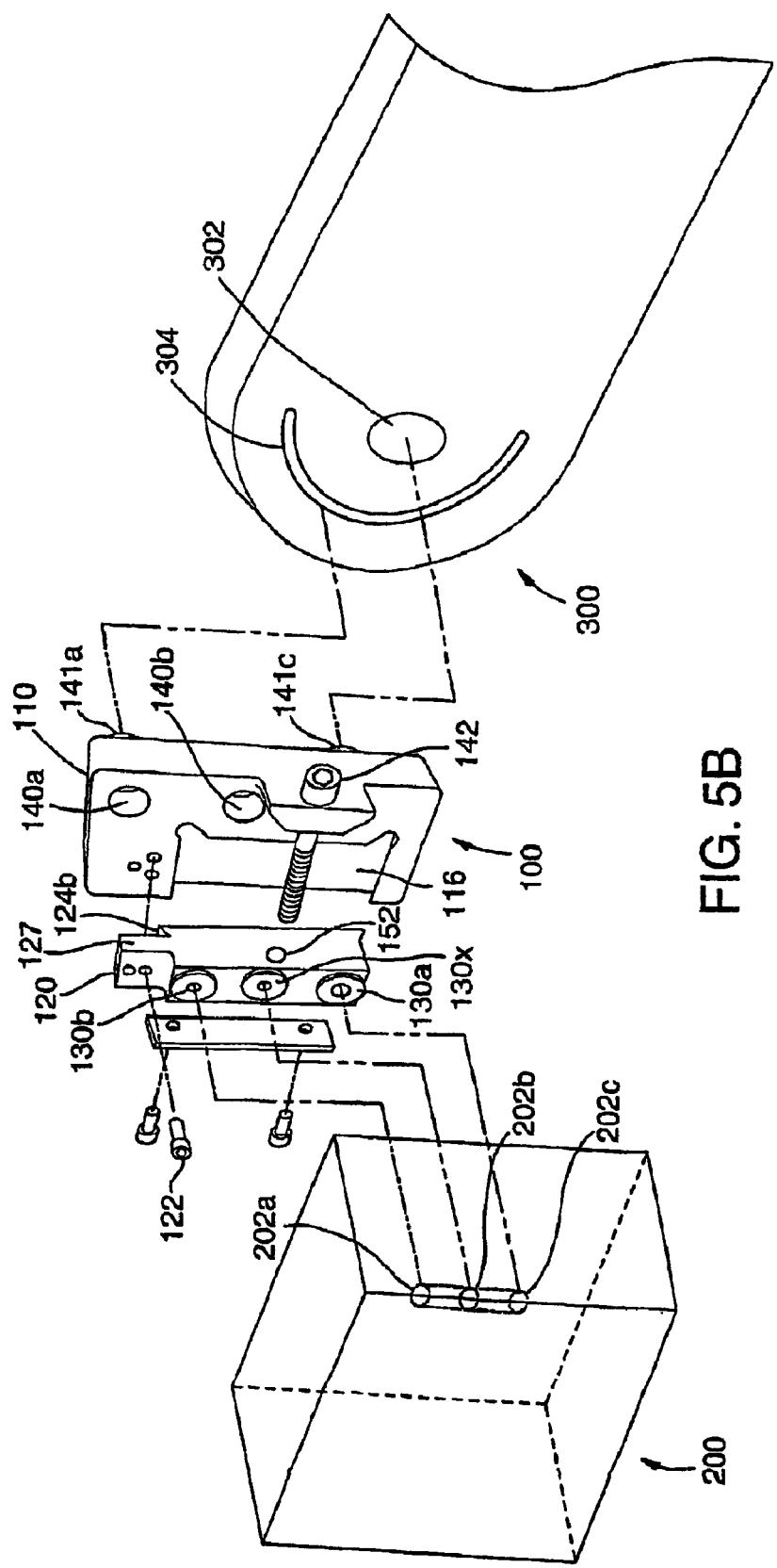
FIG. 5B is a perspective view which is useful for showing another way to use the first embodiment with a test head and a pivot cradle.

In FIG. 5A, pivot cradle 300 is attached to slider 120 and test head 200 is attached to base 110. It is understood, however, that there are other ways by which attachment unit 100 may be used to couple together a mounting unit such as pivot cradle 300 and test head 200. For example, as shown in FIG. 5B, attachment unit 100 may be used in an orientation which is the reverse of the orientation shown in FIG. 5A. Thus, in the orientation shown in FIG. 5B, extension member 112 extends towards the test head 200. As shown in FIG. 5B, slider 120 may be attached to test head 200 via openings 130a, 130x, 130b and attachment locations 202c, 202b, 202a, respectively. Furthermore, body 110 may be attached to pivot cradle 300 via openings 140a, 140b and pivot cradle location 304, attachment location 302, respectively. Thus, slider 120 moves with test head 200 in order to change the location of the center of gravity of test head 200 relative to the axis about which test head 200 rotates. One of ordinary skill in the art will recognize that attachment unit 100 may be readily attached by way of openings 140a, 140b, 140c to a wide variety of alternative structures or mechanisms. Thus, it may be rigidly attached to a yoke. As a further example it may be rigidly attached to a bearing mechanism that is also attached to the mounting unit to facilitate low friction pivoting. This would facilitate using attachment unit 100 to attach a test head 200 to a translation cradle or a gimbal mechanism. It is also readily understood that the attachment unit 100 is useful in adjusting the position of the center of gravity of the test head in combination with any apparatus that pivots together with it about the axis of interest. Thus, for example, attachment unit 100 is useful in adjusting the center of gravity combined with the yoke with respect to the pitch axis in a cable pivot system.

A further exemplary embodiment of the present invention is shown in FIGS. 6–8B. The embodiment shown in FIGS. 6–8B differs from the embodiment shown in FIGS. 1–5B in that, in the embodiment shown in FIGS. 1–5, adjustment may be made with one degree of motion. In the embodiment shown in FIGS. 6 and 7, adjustment may be made in two degrees of freedom. Thus, the second embodiment allows the position of the test head within the cradle to be modified in a first direction and in a second direction orthogonal to the first direction through the use of attachment unit 201.

Figure 6:
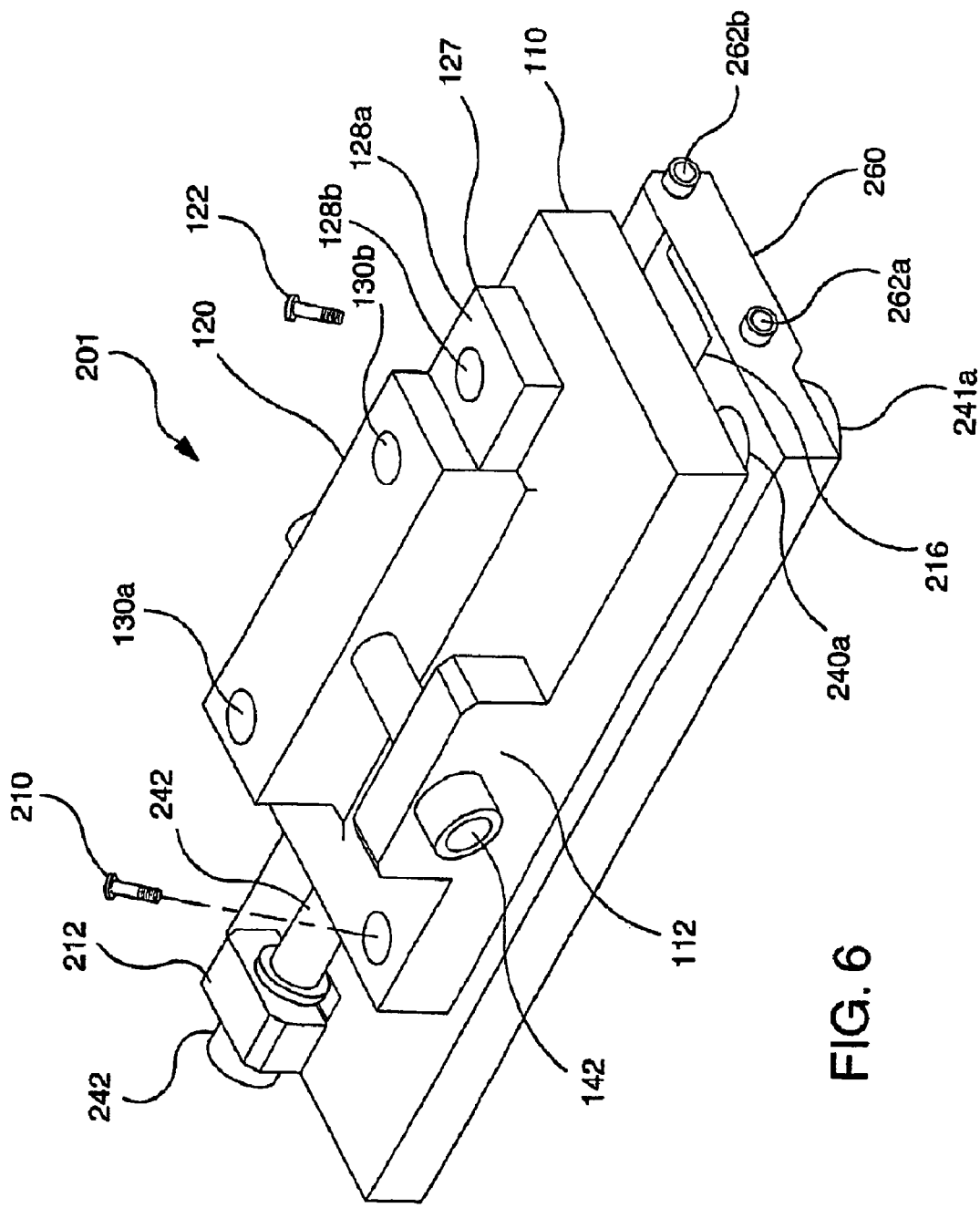
FIG. 6 is a perspective view of a second exemplary embodiment of the present invention.
Figure 7:
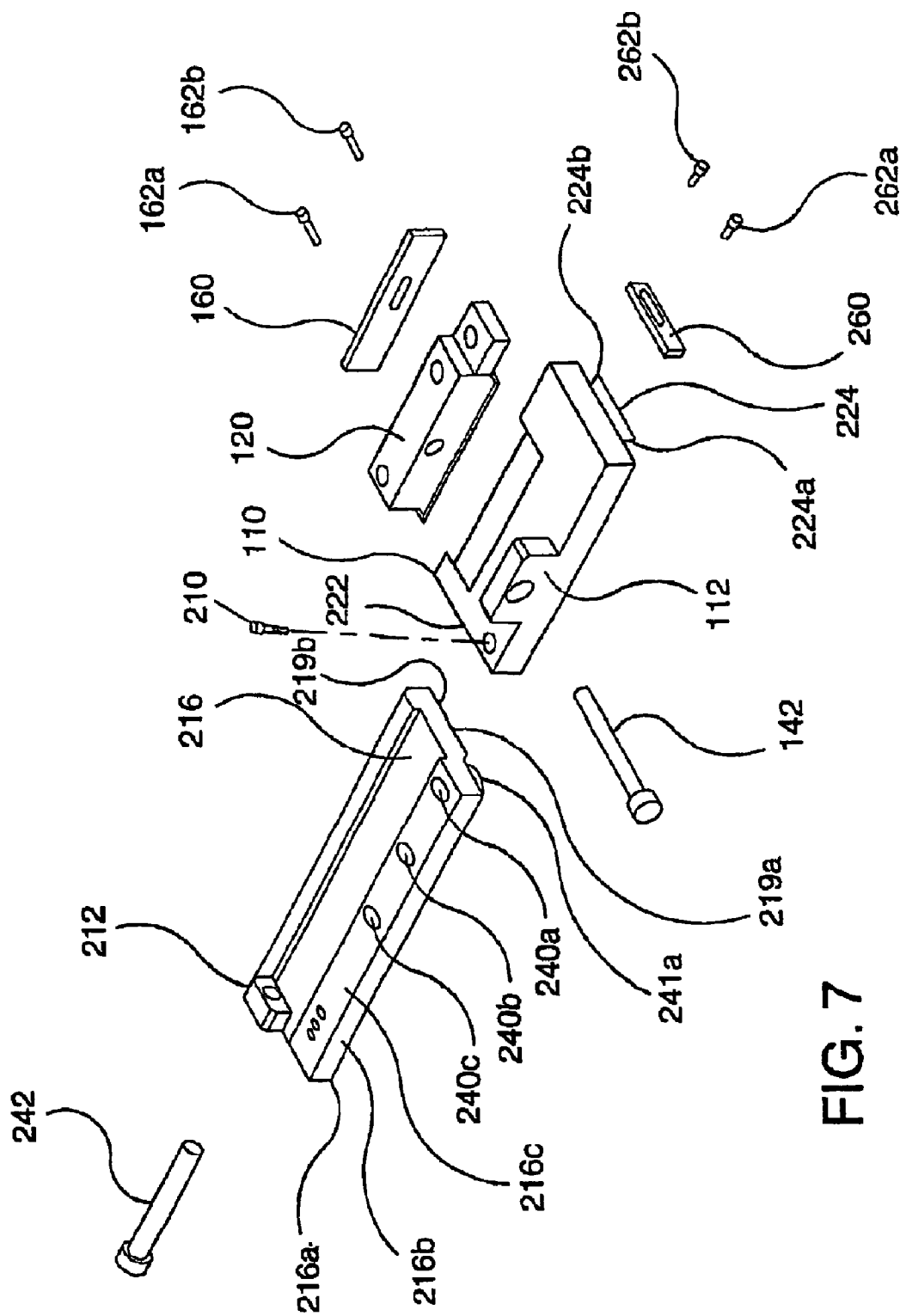
FIG. 7 is an exploded view of the apparatus shown in FIG. 6.
Figure 8A:
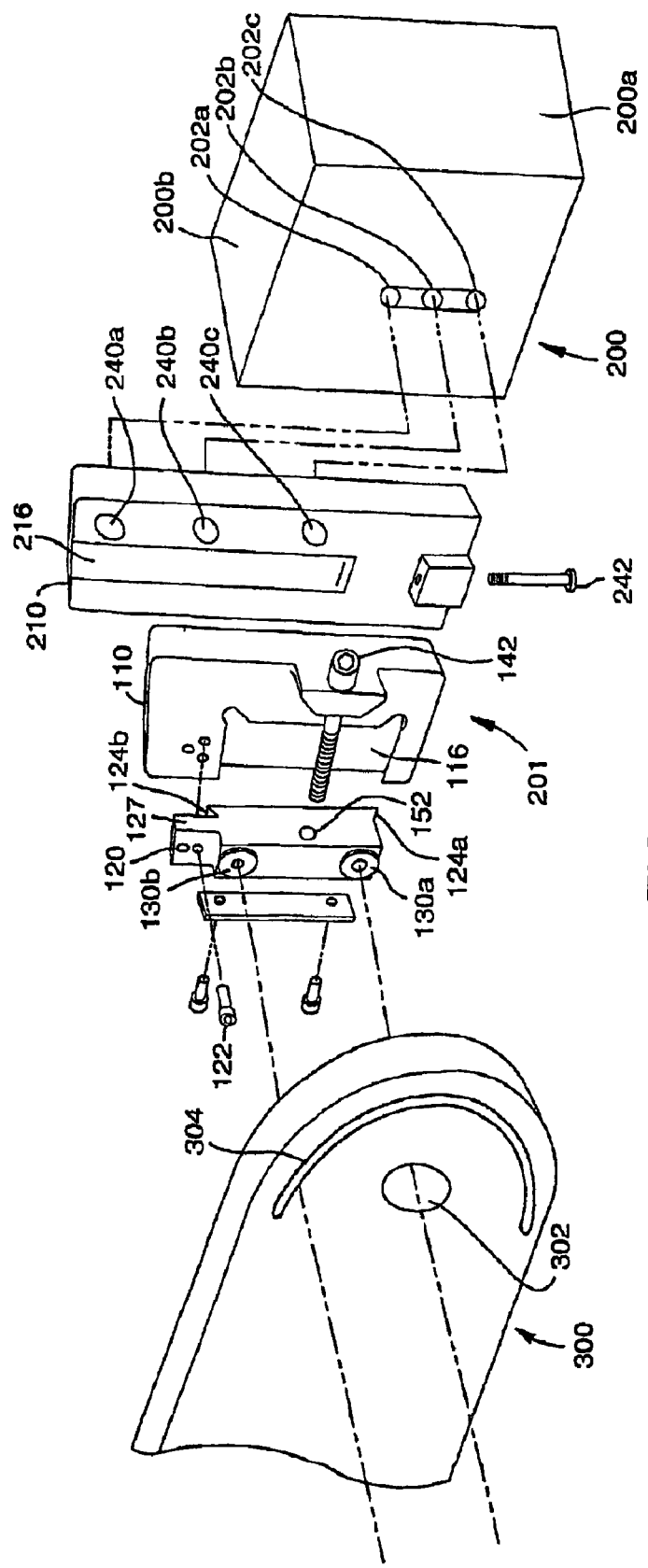
FIG. 8A is a perspective view which is useful for showing how the second embodiment is used with a test head and a pivot cradle.

As shown in FIGS. 6 and 7, the second embodiment shares some similarities with the first embodiment. Thus, for example, body 110 is included. Extension member 112 extends from body 110. Adjustment member 142 is accommodated by extension member 112. Adjustment member 142 extends through extension member 112 and is secured to slider 120. FIG. 8A illustrates attachment unit 201 used with a mounting unit that comprises a pivot cradle. Here an appropriate threaded member may extend through the pivot cradle in order to engage opening 130a so that test head 200 pivots about opening 302. Another attachment member may extend through attachment location 304 in order to engage opening 130b. As was the case with the previously described attachment unit 100, attachment unit 201 may be readily attached to any type of mounting unit.

The second exemplary embodiment differs from the first exemplary embodiment in that, in the second exemplary embodiment, a tongue portion 224 extending from the bottom of body 110 includes side walls 224a and 224b which are sloped to form a dovetail profile. The function of side walls 224a and 224b will be explained below.

As shown in FIGS. 6 and 7, secondary body 210 is included. Secondary body 210 includes secondary extension member 212. Secondary extension member 212 extends from secondary body 210. The purpose of secondary extension member 212 is to accommodate secondary adjustment member 242. Thus, secondary extension member 212 desirably includes an opening through which secondary adjustment member is inserted.

Secondary body 210 also includes secondary channel 214 with sloped sides to match the cross section of tongue portion 224. Secondary channel 214 is a portion of secondary body 210 which accommodates body 110. Thus, tongue portion 224 is inserted into secondary channel 214. Tongue portion 224 of body 110 slides within secondary channel 214 towards and away from secondary extension member 212.

As shown in FIGS. 6–8B, adjustment member 242 extends through secondary extension member 212 and is secured to body 110 through, for example, a threaded opening (not shown) in body 110. Secondary adjustment member 242 may have, for example, a threaded shaft which engages a threaded opening (not shown) in body 110. By rotating secondary adjustment member 242, body 110 moves towards and away from secondary extension member 212. Thus, by rotating secondary adjustment member 242 in one direction, body 110 moves towards secondary extension member 212. Conversely, by rotating secondary adjustment member 242 in another direction, body 110 moves away from secondary extension member 212.

FIG. 7 is an exploded view of attachment unit 201 which is useful for explaining how the different parts which comprise attachment unit 201 fit together. As is more clearly shown in FIG. 7, body 110 may be held within secondary channel 214 as a result of the formation of an optional "dovetail" structure. Thus, angling the side walls 219a, 219b of channel 214 and angling the edges 224a, 224b extending from the bottom of body 110 in order to coincide with the angle of side walls 219a, 219b creates a dovetail which helps to maintain body 110 within channel 214. This dovetail also allows body 110 to easily slide within channel 214. Plate 260 is included. Plate 260 is attached to secondary body 210 using screws 262a, 262b which are inserted through openings 261a, 261b. Screws 262a, 262b may then engage threaded openings 217a, 217b shown in FIG. 7. The purpose of secondary plate 260 is to ensure that body 110 is not permitted to slide sufficiently away from extension member 212 so that it "falls out" of secondary channel 214. Again, such a "falling out" would cause the test head to detach from the cradle. This is an extremely undesirable occurrence.

The above description has referred to a dovetail. It is understood that other configurations (for example, a "T" slot) may be used.

Secondary body 210 includes openings 240a, 240b, 240c which are useful for attaching attachment unit 200 to the test head. Thus, for example, as shown in FIG. 8A bolts may be placed through openings 240a, 240b, 240c and secured to the test head in order to attach secondary body 210 to the test head. Raised portions (of which only portion 241a is shown) may exist around openings 240a, 240b, 240c on the side of secondary body 210 facing the test head. The raised portions may add to the structural integrity of secondary body 210 as well as allowing more secure attachment of secondary body 210 to the test head.

In practice, attachment unit 201 allows the position of the test head relative to the mounting unit to be adjusted with two degrees of freedom. Thus, the position of the test head with respect to the pivot point in the mounting unit may be changed in order to accommodate a changed center of gravity. If the center of gravity of test head 200 changes along one axis, adjustment member 142 may be rotated in order to change the position of slider 120 relative to body 110 so that the test head can pivot about its center of gravity. Furthermore, if the center of gravity of test head 200 changes along a second axis orthogonal to the first axis, secondary adjustment member 242 may be rotated in order to change the position of secondary body 210 relative to body 110. Thus, for example, if the center of gravity of test head 200 is moved towards the front of test head 200 (i.e., toward face 200a), test head 200 may be moved back by rotating adjustment member 142. Alternatively, if the center of gravity of test head 200 is moved towards the back of the test head (i.e., away from front face 200a), adjustment member 142 may be rotated in the opposite direction so that test head 200 may be moved forward. If the center of gravity of test head 200 is moved towards the top of test head 200 (i.e., towards top 200b), test head 200 may be moved downward by rotating secondary adjustment member 242 so that test head 200 may be moved down. Alternatively, if the center of gravity of test head 200 is moved towards the bottom of the test head (i.e., away from top face 200b), secondary adjustment member 242 may be rotated so that test head 200 may be moved up.

As previously discussed with regard to the embodiment shown in FIGS. 5A and 5B, screw member 122 is loosened and tightened as needed so that slider 120 may slide and then be fixed in position. Screw member 222 is loosened and tightened as needed so that body 110 may slide and then be fixed in position. Screw member 222 may engage one of the openings 216a, 216b, 216c formed in secondary body 210 through an opening in body 110. Thus, when screw member 222 engages one of the openings 216a, 216b, 216c in secondary body 210, body 110 is fixed in position relative to secondary body 210.

Figure 8B:
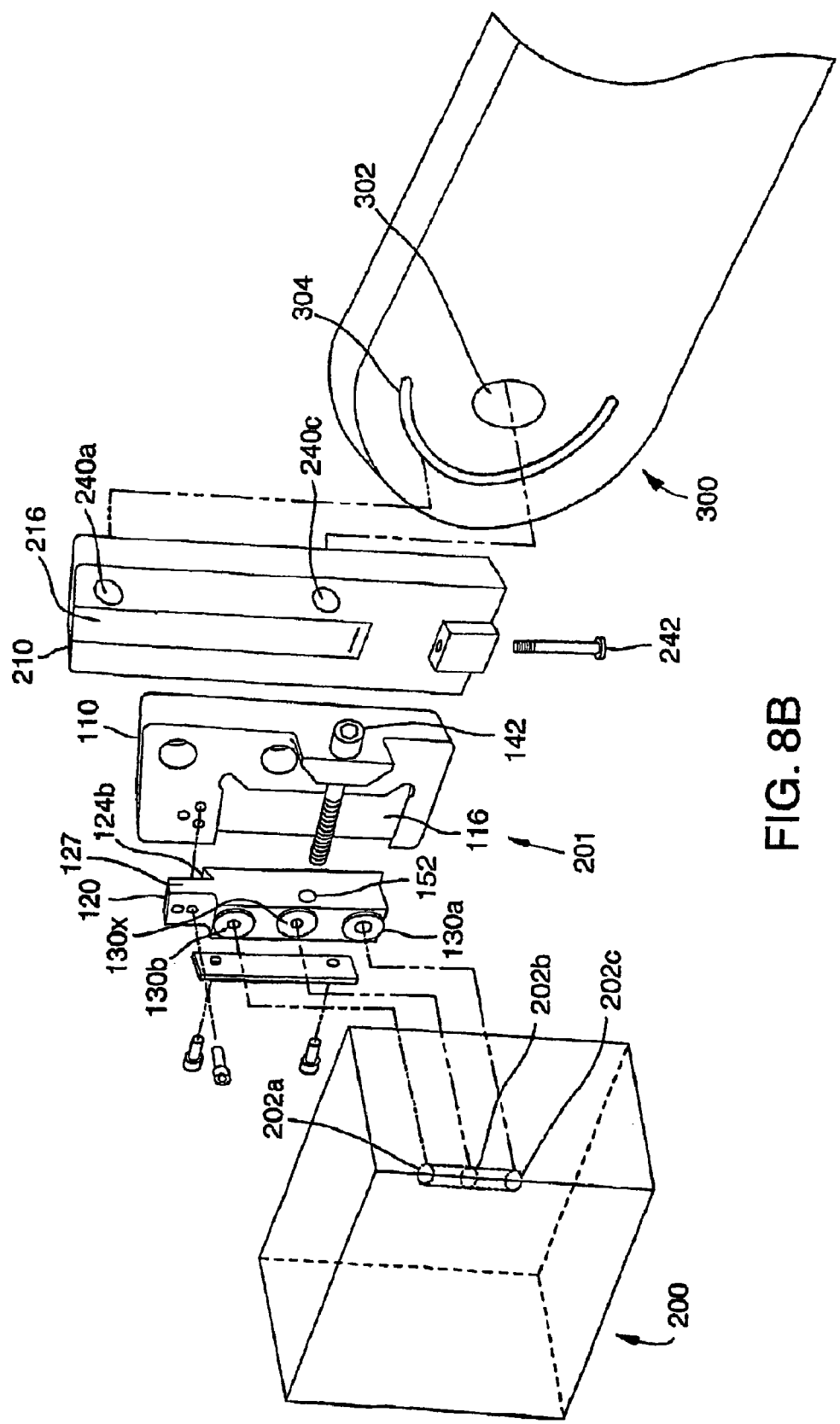
FIG. 8B is a perspective view which is useful for showing another way to use the second embodiment with a test head and a pivot cradle.

Thus, as shown in FIG. 8A, slider 120 is coupled to pivot cradle 300 and secondary body 210 is coupled to test head 200. It is understood, however, that there are other ways in which attachment unit 201 can be used to couple together test head 200 and pivot cradle 300. As shown, for example, in FIG. 8B, the orientation of attachment unit 201 may be effectively rotated relative to the orientation shown in FIG. 8A. Thus, as shown in FIG. 8B, test head 200 is coupled to slider 120 via attachment locations 202a, 202b, 202c and openings 130b, 130x, 130a, respectively. Furthermore, secondary body 210 may be coupled to pivot cradle 300 via openings 240a, 240c and pivot cradle location 304, attachment location 302, respectively. Thus, as body 110 or slider 120 moves, test head 200 moves along with body 110 and/or slider 120. It is understood, however, that attachment unit 201 may be readily used to attach a test head to numerous types and styles of mounting units in one of two basic ways. In the first, secondary body 210 is attached to the test head and slider 120 is attached to the mounting unit. In the second, slider 120 is attached to the test head and secondary body 210 is attached to the mounting unit. If the mounting unit comprises a yoke, the attachment to the yoke is done rigidly. If the mounting unit comprises a translation cradle or gimbal mechanism, the attachment may be effected with bearing units to facilitate pivoting of the test head. Attachment to a pivot cradle may also be effected with bearing units if it is so desired.

It is furthermore readily understood that the attachment unit 210 is useful in adjusting the position of the center of gravity of the test head in combination with any apparatus that pivots together with it about the axis of interest. Thus, for example, attachment unit 100 is useful in adjusting the center of gravity combined with the yoke with respect to the pitch axis in a cable pivot system.

In FIG. 8B, body 110 is shown in the drawing as sliding vertically while slider 120 is shown as moving horizontally. It is understood, however, to one of ordinary skill in the art that body 110 and slider 120 may be redesigned so that body 110 moves horizontally relative to secondary body 210 (as shown) and slider 120 moves vertically relative to body 110 (as shown).

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. An apparatus for coupling a test head to a mounting unit in which said test head pivots, said apparatus comprising:
   a base having a plurality of base attachment locations at which said base attaches to one of said test head and said mounting unit;
   a slider which slides away from and towards a center of gravity of said test head, said slider including at least one slider attachment location at which said slider attaches to another of said test head and said mounting unit; and
   an adjustment member for changing a position of said slider relative to said base.

2. An apparatus for coupling a test head to a mounting unit according to claim 1, wherein said base includes an extension member extending away from said test head and wherein said adjustment member extends from said extension member for fixing the position of the slider relative to the base.

3. An apparatus for coupling a test head to a mounting unit according to claim 1, wherein said base includes an extension member extending towards said test head and wherein said adjustment member extends from said extension member for fixing the position of the slider relative to the base.

4. An apparatus for coupling a test head to a mounting unit according to claim 1, wherein said sliding member slides within a channel formed in said base.

5. An apparatus for coupling a test head to a mounting unit according to claim 1, further comprising a secondary base which slides away from and towards said center of gravity of said test head in a direction having an orthogonal component relative to a further direction in which said slider slides.

6. An apparatus for coupling a test head to a mounting unit according to claim 5, wherein said secondary base is situated between said slider and said base.

7. An apparatus for coupling a test head to a mounting unit according to claim 5, further comprising a further adjustment member for changing a further position of said secondary base relative to said base.

8. An apparatus for coupling a test head to a mounting unit in which said test head pivots, said apparatus comprising a base having a slider which slides relative to said base;
   a first location of said base for attaching said base to one of said test head and said mounting unit;
   a second location of said slider for attaching said slider to another of said test head and said mounting unit; and
   a fastening device for preventing sliding of said slider relative to said base.

9. An apparatus for coupling a test head to a mounting unit according to claim 8, wherein said base includes an extension member extending away from said test head and wherein said adjustment member extends from said extension member for fixing the position of the slider relative to the base.

10. An apparatus for coupling a test head to a mounting unit according to claim 8, wherein said base includes an extension member extending towards said test head and wherein said adjustment member extends from said extension member for fixing the position of the slider relative to the base.

11. An apparatus for coupling a test head to a mounting unit according to claim 8, wherein said sliding member slides within a channel formed in said base.

12. An apparatus for coupling a test head to a mounting unit in which said test head pivots, said apparatus comprising:

base means for being attached to one of said test head and said mounting unit;
slider means for sliding away from and towards a center of gravity of said test head; and
adjustment means for changing a position of said base means relative to said slider means.

* * * * *

UNITED STATES PATENT AND TRADEMARK OFFICE
CERTIFICATE OF CORRECTION

| | |
|---|---|
| PATENT NO. | : 6,975,105 B2 |
| APPLICATION NO. | : 10/380313 |
| DATED | : December 13, 2005 |
| INVENTOR(S) | : Naum Gudin |

It is certified that error appears in the above-identified patent and that said Letters Patent is hereby corrected as shown below:

Column 12, insert the following Claims 23 --23. An apparatus for coupling a test head to a mounting unit in which said test head pivots, said apparatus comprising:

a base;

a secondary base having a first location for attaching said secondary base to one of said test head and said mounting unit;

an adjustment member for changing a position of said secondary base relative to said base so that said secondary base slides away from and towards a center of gravity of said test head;

a slider having a second location for attaching said slider to another of said test head and said mounting unit; and a further adjustment member for changing a further position of said slider relative to said secondary base in a direction having an orthogonal component relative to the direction in which said secondary base slides.--

Column 12, insert the following Claim 24 --24. An apparatus for coupling a test head to a mounting unit according to claim 23, wherein said slider slides within a channel formed in said secondary base.--

Column 12, insert the following Claim 25 --25. An apparatus for coupling a test head to a mounting unit according to claim 23, wherein said secondary base slides within a further channel formed in said base.--

Column 12, insert the following Claim 26 --26. An apparatus for coupling a test head to a mounting unit according to claim 23, wherein said base includes an extension member extending away from said test head and wherein said adjustment member extends from said extension member for fixing the position of the slider relative to the base.--

Column 12, insert the following Claim 27 --27. An apparatus for coupling a test head to a mounting unit according to claim 23, wherein said base includes an extension member extending away from said mounting unit and wherein said adjustment member extends from said extension member for fixing the position of the slider relative to the base.--

UNITED STATES PATENT AND TRADEMARK OFFICE
CERTIFICATE OF CORRECTION

PATENT NO.        : 6,975,105 B2
APPLICATION NO.   : 10/380313
DATED             : December 13, 2005
INVENTOR(S)       : Naum Gudin It is certified that error appears in the above-identified patent and that said Letters Patent is hereby corrected as shown below:

Column 12, insert the following Claim 28 --28. An apparatus for coupling a test head to a mounting unit according to claim 23, further comprising a fastening device for at least one of:

a) preventing movement of said slider relative to said secondary base and b) preventing movement of said secondary base relative to base.--

Signed and Sealed this

Thirtieth Day of October, 2007

JON W. DUDAS
*Director of the United States Patent and Trademark Office*